United States Patent
Konoshita et al.

(10) Patent No.: US 9,325,311 B1
(45) Date of Patent: Apr. 26, 2016

(54) GATE DRIVER AND DISPLAY DEVICE USING THE SAME

(71) Applicant: Innolux Corporation, Chu-Nan (TW)

(72) Inventors: Shinji Konoshita, Chu-Nan (TW); Kazuyuki Hashimoto, Chu-Nan (TW)

(73) Assignee: INNOLUX CORPORATION, Chu-Nan (TW)

( * ) Notice: Subject to any disclaimer, the term of this patent is extended or adjusted under 35 U.S.C. 154(b) by 0 days.

(21) Appl. No.: 14/549,498

(22) Filed: Nov. 20, 2014

(51) Int. Cl.
*H03K 17/68* (2006.01)
*H03K 17/687* (2006.01)
*G09G 3/36* (2006.01)
*G09G 5/14* (2006.01)

(52) U.S. Cl.
CPC ............ *H03K 17/687* (2013.01); *G09G 3/3655* (2013.01); *G09G 3/3696* (2013.01); *G09G 5/14* (2013.01); *G09G 2330/021* (2013.01)

(58) Field of Classification Search
CPC ... G09G 3/20; G09G 3/34; G09G 2300/0809; G09G 2300/0819; H03K 3/012; H03K 17/162; H03K 3/356; H03K 17/687
USPC ............ 327/108, 109, 172, 307, 384; 345/99, 345/212, 214, 215, 596, 694
See application file for complete search history.

(56) References Cited

U.S. PATENT DOCUMENTS

| | | | |
|---|---|---|---|
| 5,990,857 A * | 11/1999 | Kubota | G09G 3/3648 345/100 |
| 6,052,426 A | 4/2000 | Maurice | |
| 2005/0008114 A1* | 1/2005 | Moon | G09G 3/3677 377/64 |

* cited by examiner

*Primary Examiner* — John Poos
(74) *Attorney, Agent, or Firm* — Rabin & Berdo, P.C.

(57) ABSTRACT

A gate driver comprises an $i^{th}$ stage gate driver circuit including a latch circuit and a first output circuit. The latch circuit includes a first input for receiving an $(i-1)^{th}$ gate signal, a second input for receiving a first clock signal, a first output for outputting a first output signal, and a second output for outputting a second output signal. The first output circuit comprises a first transistor, a second transistor and a capacitor. The first transistor includes a control terminal coupled to the first output, a first terminal coupled to a first clock input and a second terminal coupled to a first output node. The second transistor includes a control terminal coupled to the second output, a first terminal coupled to the first output node and a second terminal coupled to a reference signal. The capacitor is coupled between the first transistor and the first output node.

20 Claims, 11 Drawing Sheets

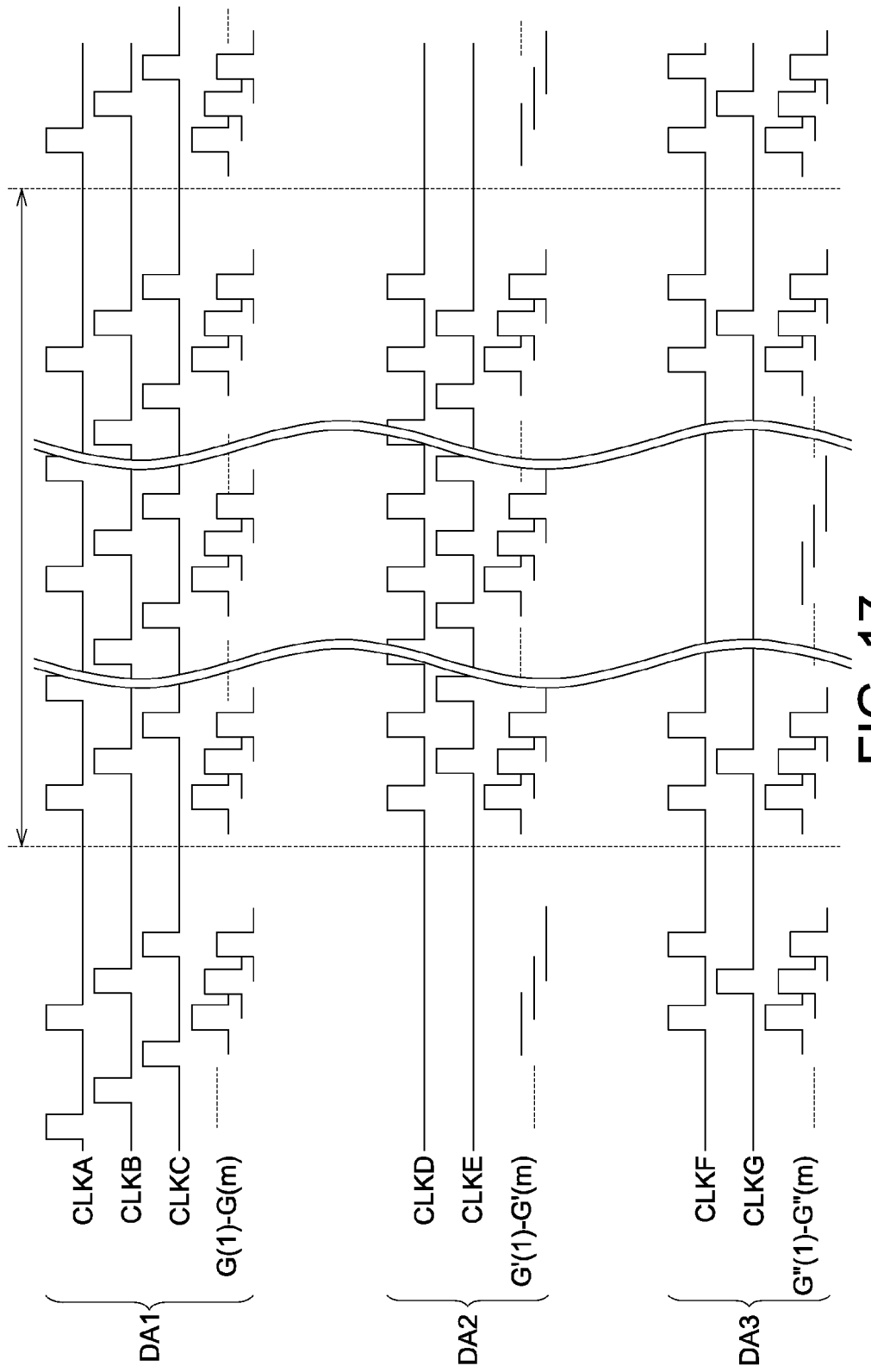

US 9,325,311 B1

GATE DRIVER AND DISPLAY DEVICE USING THE SAME

TECHNICAL FIELD

The disclosure relates in general to a gate driver and a display device using the same, and in particular, to a gate driver having a latch circuit functioning like a RS latch and a display device using the same.

BACKGROUND

Recently, display devices such as liquid crystal displays (LCD) and organic light-Emitting diode (OLED) displays are commonly used in portable computer systems, televisions and other electronic devices. In order to display images, the display devices require gate drivers to perform scan function.

However, because a huge number of transistors and signal inputs are used in a conventional gate driver, the layout area and the power consumption of the gate driver are large. Thus, conventional gate drivers are not suitable for developing a narrow ledged display panel, or borderless display panel.

Therefore, there is a need for providing a gate driver and a display device using the same, which have smaller layout area and lower power consumption.

SUMMARY

The disclosure is directed to a gate driver and a display device using the same. The gate driver/display device of the present disclosure uses less number of components and input signals. Therefore, the layout area and power consumption of the gate driver/display device of the present disclosure can be reduced. Moreover, the gate driver of the present disclosure can be used in a multi-zone display device. Because the gate driver can respectively perform adaptive scan functions for each display area of the multi-zone display device, the power consumption of the multi-zone display device can be reduced.

According to one embodiment of the present disclosure, a gate driver is provided. The gate driver comprises a plurality of gate driver circuits cascade-connected to each other, for outputting a plurality of first gate signals sequentially, wherein an $i^{th}$ stage gate driver circuit of the gate driver circuits, where i is an integer, comprises a latch circuit and a first output circuit. The latch circuit includes a first input for receiving an $(i-1)^{th}$ gate signal of the gate signals from an $(i-1)^{th}$ stage gate driver circuit of the gate driver circuits, a second input for receiving a first clock signal, a first output for outputting a first output signal in response to the $(i-1)^{th}$ gate signal and the first clock signal, and a second output for outputting a second output signal being an inverted signal of the first output signal. The first output circuit is used for outputting an $i^{th}$ first gate signal, comprising a first transistor, a second transistor and a capacitor. The first transistor includes a control terminal coupled to the first output, a first terminal coupled to a first clock input for receiving a second clock signal and a second terminal coupled to a first output node for outputting the $i^{th}$ first gate signal. The second transistor includes a control terminal coupled to the second output, a first terminal coupled to the first output node and a second terminal coupled to a reference signal. The capacitor is coupled between the control terminal of the first transistor and the first output node.

According to another embodiment of the present disclosure, a display device is provided. The display device comprises a first display area for displaying a first image and a first gate driver for outputting a plurality of first gate signals to the first display area. The first gate driver comprises a plurality of gate driver circuits cascade-connected to each other, for outputting a plurality of first gate signals sequentially, wherein an $i^{th}$ stage gate driver circuit of the gate driver circuits, where i is an integer, comprises a latch circuit and a first output circuit. The latch circuit includes a first input for receiving an $(i-1)^{th}$ gate signal of the gate signals from an $(i-1)^{th}$ stage gate driver circuit of the gate driver circuits, a second input for receiving a first clock signal, a first output for outputting a first output signal in response to the $(i-1)^{th}$ gate signal and the first clock signal, and a second output for outputting a second output signal being an inverted signal of the first output signal. The first output circuit is used for outputting an $i^{th}$ first gate signal, comprising a first transistor, a second transistor and a capacitor. The first transistor includes a control terminal coupled to the first output, a first terminal coupled to a first clock input for receiving a second clock signal and a second terminal coupled to a first output node for outputting the $i^{th}$ first gate signal. The second transistor includes a control terminal coupled to the second output, a first terminal coupled to the first output node and a second terminal coupled to a reference signal. The capacitor is coupled between the control terminal of the first transistor and the first output node.

BRIEF DESCRIPTION OF THE DRAWINGS

FIG. 17 shows waveforms of the 3-zone gate driver according to one embodiment of the present disclosure.

DETAILED DESCRIPTION OF THE INVENTION

Figure 1:
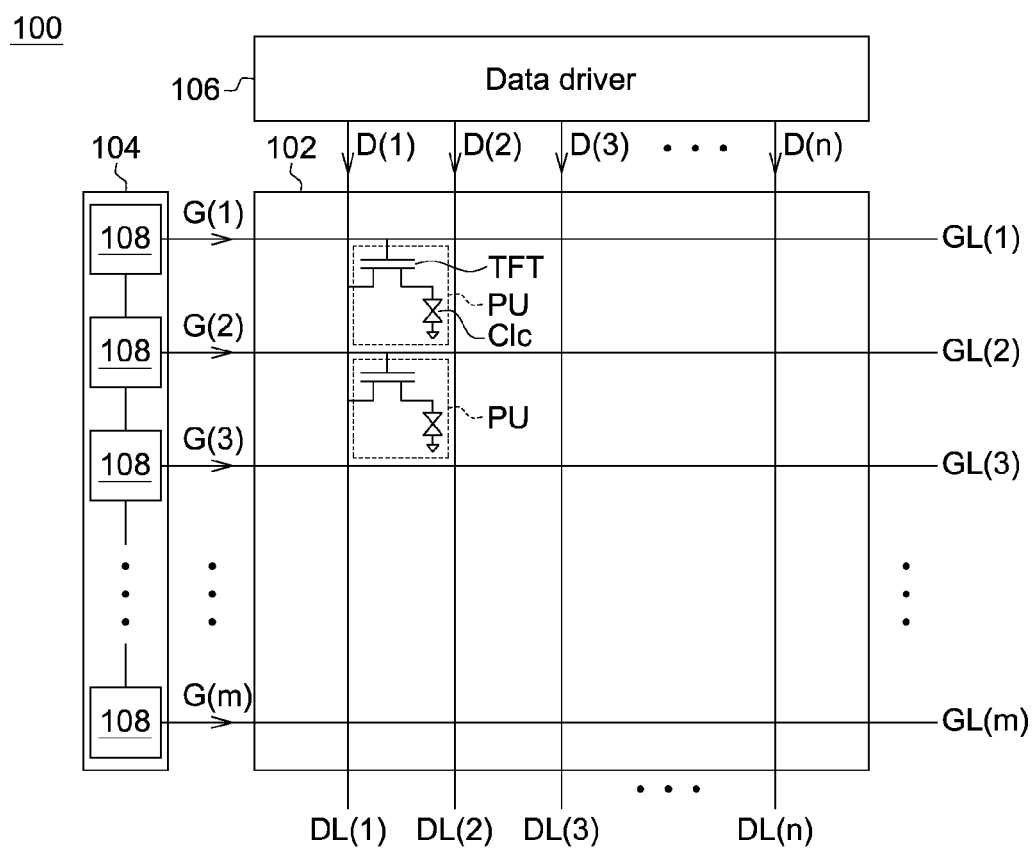
FIG. 1 shows a display device according to one embodiment of the present disclosure.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 shows a display device 100 according to one embodiment of the present disclosure. The liquid crystal display device 100 comprises a display panel 102, a gate driver 104 and a data driver 106. The display panel 102 includes a plurality of pixel units PU arranged in a matrix and is configured to display images. In one embodiment, each pixel unit PU is defined by the crossing of a gate line GL(i) and a data line DL(i), where i is an integer. Each pixel unit PU includes, for example, a liquid crystal capacitor Clc and a thin film transistor (TFT). The gate driver 104 is configured to drive the gate lines GL(1)-GL(m) of the display panel 102, where m is an integer larger than or equal to i. As shown in FIG. 1, the gate driver 104 comprises a plurality of gate driver circuits 108 cascade-connected to each other for outputting a plurality of first gate signals G(1)-G(m) sequentially. The first gate signals G(1)-G(m) outputted by the gate driver circuits 108 can be used for switching on the thin film transistors TFT of the pixel units PU. The data driver 106 is configured to drive the data lines DL(1)-DL(n) of the display panel 102, where n is an integer larger than or equal to i. In one embodiment, the data driver 106 applies data signals D(1)-D(n) to the pixel units PU through the data lines DL(1)-DL(n), and thus controls the light transmittance of the liquid crystal capacitors Clc of the pixel units PU.

Figure 2:
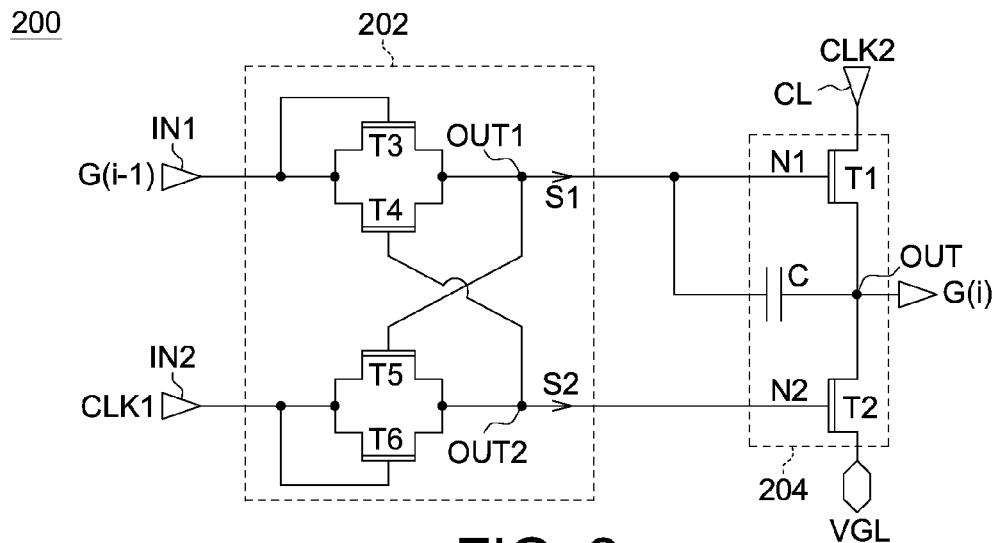
FIG. 2 shows a circuit diagram of a gate driver circuit according to one embodiment of the present invention.

FIG. 2 shows a circuit diagram of a gate driver circuit 200 according to one embodiment of the present invention. The gate driver circuit 200 can be an $i^{th}$ stage gate driver circuit of a plurality of stages of gate driver circuits cascade-connected to each other. In one embodiment, the gate driver circuit 200 can be used as the $i^{th}$ stage gate driver circuit 108 shown in FIG. 1, but the present disclosure is not limited thereto.

The gate driver circuit 200 comprises a latch circuit 202 and a first output circuit 204. The latch circuit 202 includes a first input IN1, a second input IN2, a first output OUT1 and a second output OUT2. The first input IN1 is used for receiving an $(i-1)^{th}$ first gate signal G(i-1) from an $(i-1)^{th}$ stage (i.e., the previous stage) gate driver circuit. The second input IN2 is used for receiving a first clock signal CLK1. The first output OUT1 is used for outputting a first output signal S1 in response to the $(i-1)^{th}$ first gate signal G(i-1) and the first clock signal CLK1. The second output OUT2 is used for outputting a second output signal S2 being an inverted signal of the first output signal S1. In one embodiment, the latch circuit 202 includes a RS latch, wherein the first input IN1, a second input IN2, a first output OUT1 and a second output OUT2 are the S terminal, R terminal, Q terminal and Q' terminal of the RS latch, respectively.

The first output circuit 204 is used for outputting an $i^{th}$ first gate signal G(i), comprising a first transistor T1, a second transistor T2 and a capacitor C. The first transistor T1 includes a control terminal N1 coupled to the first output OUT1, a first terminal coupled to a first clock input CL for receiving a second clock signal CLK2 and a second terminal coupled to a first output node OUT for outputting the $i^{th}$ first gate signal G(i). The second transistor T2 includes a control terminal N2 coupled to the second output OUT2, a first terminal coupled to the first output node OUT and a second terminal coupled to a reference signal VGL. In one embodiment, the reference signal VGL is a voltage to turn-off the thin film transistors TFT of the pixel units PU. The capacitor C is coupled between the control terminal N1 of the first transistor T1 and the first output node OUT. The capacitor C can be used as a bootstrap capacitor for providing needed voltage of the control terminal N1 of the first transistor T1. For example, when the voltage level of the control terminal N1 is high, the capacitor C can provide a biased voltage exceeding the voltage level of the second clock signal CLK2 to the control terminal N1 to ensure that the first transistor T1 is turned on.

The latch circuit 202 comprises a third transistor T3, a fourth transistor T4, a fifth transistor T5 and a sixth transistor T6. The third transistor T3 includes a control terminal coupled to the first input IN1, a first terminal coupled to the first output OUT1 and a second terminal coupled to the first input IN1. The fourth transistor T4 includes a control terminal coupled to the second output OUT2, a first terminal coupled to the first output OUT1 and a second terminal coupled to the first input IN1. The fifth transistor T5 includes a control terminal coupled to the first output OUT1, a first terminal coupled to the second output OUT2 and a second terminal coupled to the second input IN2. The sixth transistor T6 includes a control terminal coupled to the second input IN2, a first terminal coupled to the second output OUT2 and a second terminal coupled to the second input IN2. In the embodiment, the first to sixth transistors T1-T6 can be realized by n-channel TFTs.

As shown in FIG. 2, the gate driver circuit 200 merely applies four input signals (G(i-1), CLK1, CLK2 and VGL), one capacitor (C) and six transistors (T1-T6). Therefore, the layout area of the gate driver circuit 200 can be smaller and the power consumption of the gate driver circuit 200 can be reduced.

Figure 3:
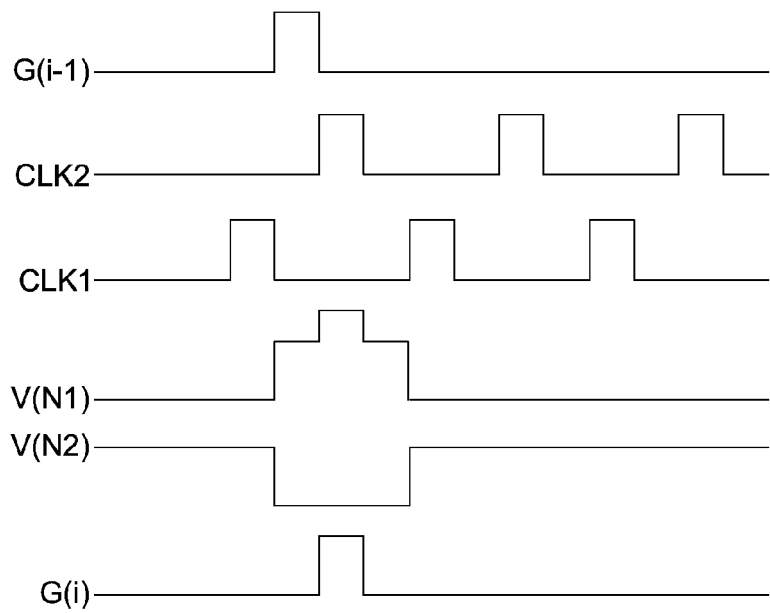
FIG. 3 shows the signal waveforms of the gate driver circuit according to one embodiment of the present disclosure.

FIG. 3 shows the signal waveforms of the gate driver circuit 200 according to one embodiment of the present disclosure. In the embodiment, when the $(i-1)^{th}$ first gate signal G(i-1) is enabled (e.g., with a high voltage level) and the first clock signal CLK1 is disabled (e.g., with a low voltage level), the first transistor T1 is turned on by the first output signal S1 because the voltage level of the control terminal N1 (say V(N1)) is high and the second transistor T2 is turned off by the second output signal S2 because the voltage level of the control terminal N2 (say V(N2)) is low. At this time, the voltage level of the $i^{th}$ first gate signal G(i) follows the voltage level of the second clock signal CLK2. On the other hand, when the $(i-1)^{th}$ first gate signal G(i-1) is disabled (e.g., with a low voltage level) and the first clock signal CLK1 is enabled (e.g., with a high voltage level), the first transistor T1 is turned off by the first output signal S1 because the voltage level of the control terminal N1 V(N1) is low and the second transistor T2 is turned on by the second output signal S2 because the voltage level of the control terminal N2 V(N2) is high. At this time, the voltage level of the $i^{th}$ first gate signal G(i) can be reset by the reference signal VGL.

Figure 4:
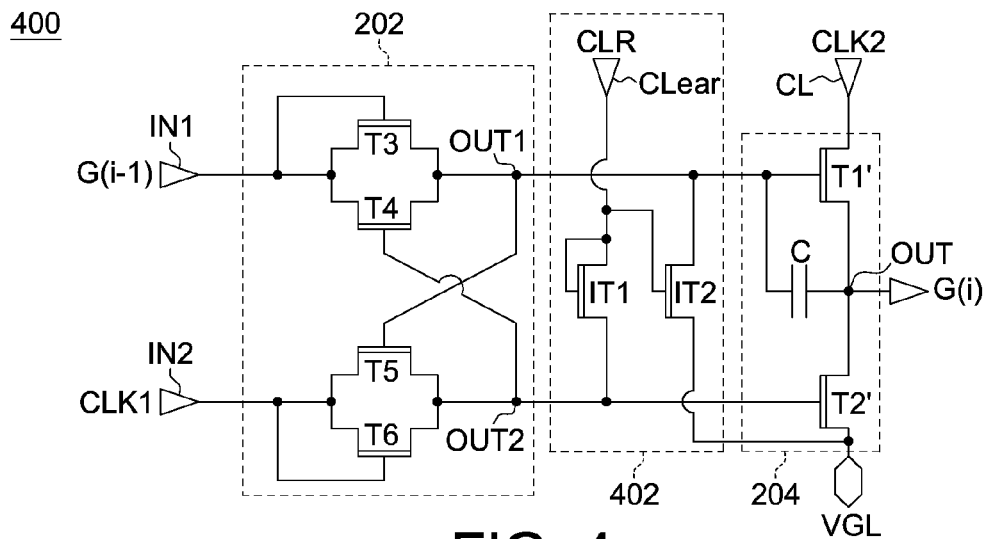
FIG. 4 shows a circuit diagram of a gate driver circuit according to one embodiment of the present invention.

FIG. 4 shows a circuit diagram of a gate driver circuit 400 according to one embodiment of the present invention. The gate driver circuit 400 can be an $i^{th}$ stage gate driver circuit of a plurality of stages of gate driver circuits cascade-connected to each other. In one embodiment, the gate driver circuit 400 can be used as the $i^{th}$ stage gate driver circuit 108 shown in FIG. 1, but the present disclosure is not limited thereto.

The elements in the embodiment and in the previous embodiments sharing the same labeling are the same elements, and the description of which are as aforementioned. The main difference between the gate driver circuit 400 and the gate driver circuit 200 shown in FIG. 2 is that the gate driver circuit 400 further comprises an initialization circuit 402.

The initialization circuit 402 is used for initializing the voltage levels of the first and second outputs OUT1, OUT2 by the reference signal VGL in response to a clearing signal CLR. The initialization circuit 402 comprises a first initialization transistor IT1 and a second initialization transistor IT2. The first initialization transistor IT1 includes a control terminal coupled to the a clearing terminal CLear for receiving the clearing signal CLR, a first terminal coupled to the clearing terminal CLear, and a second terminal coupled to the second output OUT2. The second initialization transistor IT2 includes a control terminal coupled to the clearing terminal CLear, a first terminal coupled to the first output OUT1, and a second terminal coupled to the reference signal VGL. In the embodiment, because the control terminal (e.g., a gate terminal) and the first terminal (e.g., a drain terminal) of the first initialization transistor IT1 is connected to each other, the first initialization transistor IT1 forms a diode-connection and the voltage level of the second output OUT2 can be initialized by the clearing signal CLR when the clearing signal CLR is enabled. Accordingly, the second initialization transistor IT2 can be turned on and the voltage level of the first output OUT1 can be initialized by the reference signal VGL. In one embodiment, the clearing signal CLR is enabled when the display device is powered up.

In the embodiment of FIG. 4, the first to sixth transistors T1-T6 and the first and second initialization transistors IT1, IT2 are n-channel TFTs, but the present disclosure is not limited thereto. In another embodiment, the transistors included in the gate driver circuit can be realized by p-channel transistors.

Figure 5:
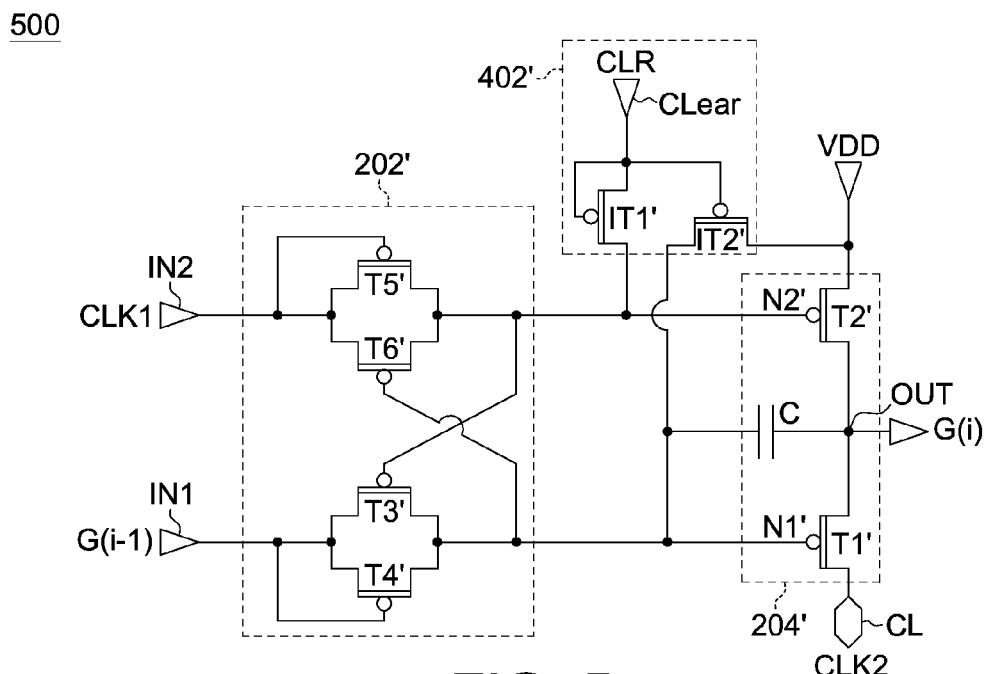
FIG. 5 shows a circuit diagram of a gate driver circuit according to one embodiment of the present invention.

FIG. 5 shows a circuit diagram of a gate driver circuit 500 according to one embodiment of the present invention. The gate driver circuit 500 can be an $i^{th}$ stage gate driver circuit of a plurality of stages of gate driver circuits cascade-connected to each other. In one embodiment, the gate driver circuit 500 can be used as the $i^{th}$ stage gate driver circuit 108 shown in FIG. 1, but the present disclosure is not limited thereto.

The circuit configuration of the gate driver circuit 500 is similar to that of the gate driver circuit 400, where similar elements are given similar reference numerals with prime notation "'". The main difference between the gate driver circuit 500 and the gate driver circuit 400 shown in FIG. 4 is that the transistors included in the gate driver circuit 500 are realized by p-channel transistors. In another embodiment, the initialization circuit 402' can be omitted.

Figure 6:
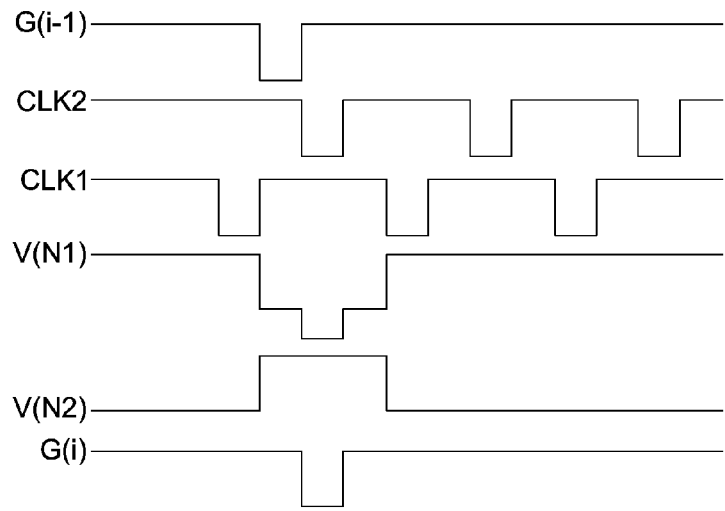
FIG. 6 shows the signal waveforms of the gate driver circuit according to one embodiment of the present disclosure.

FIG. 6 shows the signal waveforms of the gate driver circuit 500 according to one embodiment of the present disclosure. As shown in FIG. 6, the signal operation of the gate driver circuit 500 is similar to that of the gate driver circuit 200/400 but the signal waveforms are inverted.

Figure 7:
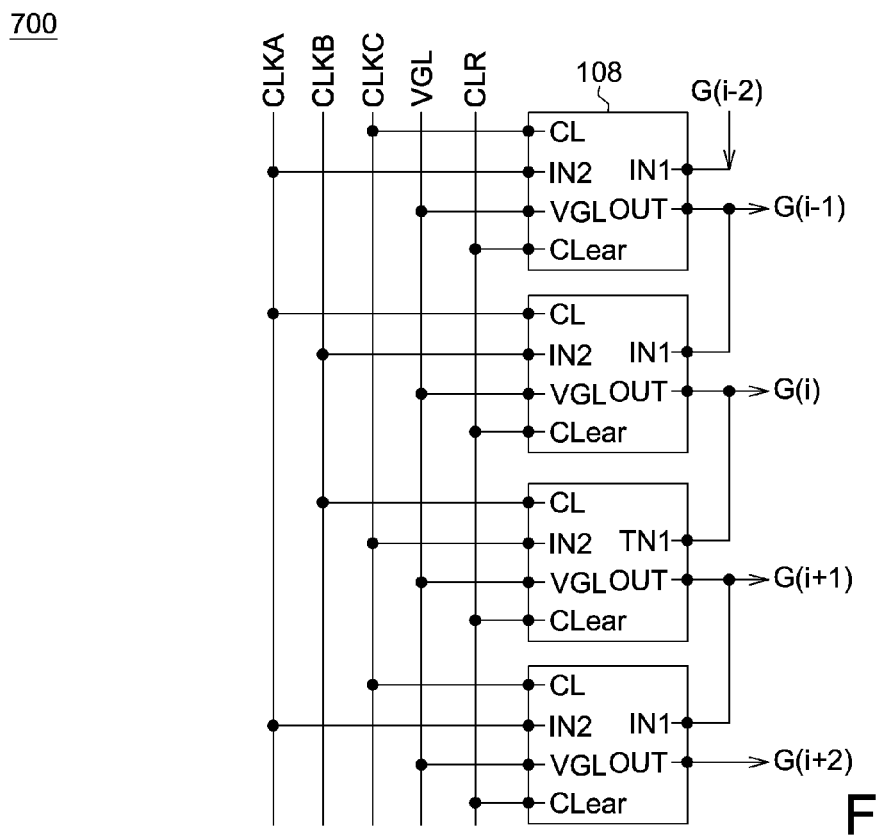
FIG. 7 shows a gate driver according to one embodiment of the present disclosure.

FIG. 7 shows a gate driver 700 according to one embodiment of the present disclosure. The gate driver 700 can be used as the gate driver 104 shown in FIG. 1, but the present disclosure is not limited thereto.

The gate driver 700 comprises a plurality of stages of gate driver circuits 108. As shown in FIG. 7, the $(i-1)^{th}$ to $(i+2)^{th}$ stages of gate driver circuits 108 are respectively configured to output the first gate signals G(i−1) to G(i+2). In the embodiment, the gate driver circuits 108 may output the first gate signals G(i−1) to G(i+2) in response to three clock signals CLKA, CLKB and CLKC.

As shown in FIG. 7, the clock CLKA signal is applied to the second input IN2 of the $(i-1)^{th}$ stage gate driver circuit 108 and the first clock input CL of the $i^{th}$ stage gate driver circuit 108. The clock signal CLKB is applied to the second input IN2 of the $i^{th}$ stage gate driver circuit 108 and the first clock input CL of the $(i+1)^{th}$ stage gate driver circuit 108. The clock signal CLKC is applied to the first clock input CL of the $(i-1)^{th}$ stage gate driver circuit 108 and the second input IN2 of the $(i+1)^{th}$ stage gate driver circuit 108. Note that for illustrative simplicity, only four stages of the gate driver circuits 108 are shown in FIG. 7. However, the scope and spirit of the invention can also be applied to the gate driver circuit 108 with more or less than four stages of the gate driver circuits 108, and the invention is not limited thereto.

Figure 8:
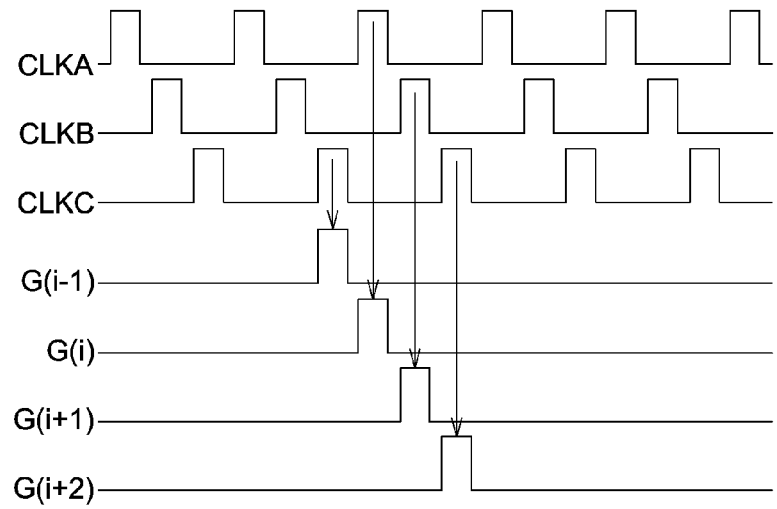
FIG. 8 shows waveforms of the gate driver according to one embodiment of the present disclosure.

FIG. 8 shows waveforms of the gate driver 700 according to one embodiment of the present disclosure. As shown in FIG. 8, in the embodiment, the clock signals CLKA, CLKB and CLKC are not overlapped with each other and enabled sequentially in a time sequence. In response to the clock signals CLKA, CLKB and CLKC, the first gate signals G(i−1), G(i), G(i+1) and G(i+2) can be outputted sequentially. In other words, in the embodiment, only 3 clock signals can realize a complete gate scan function of the gate driver 700.

Figure 9:
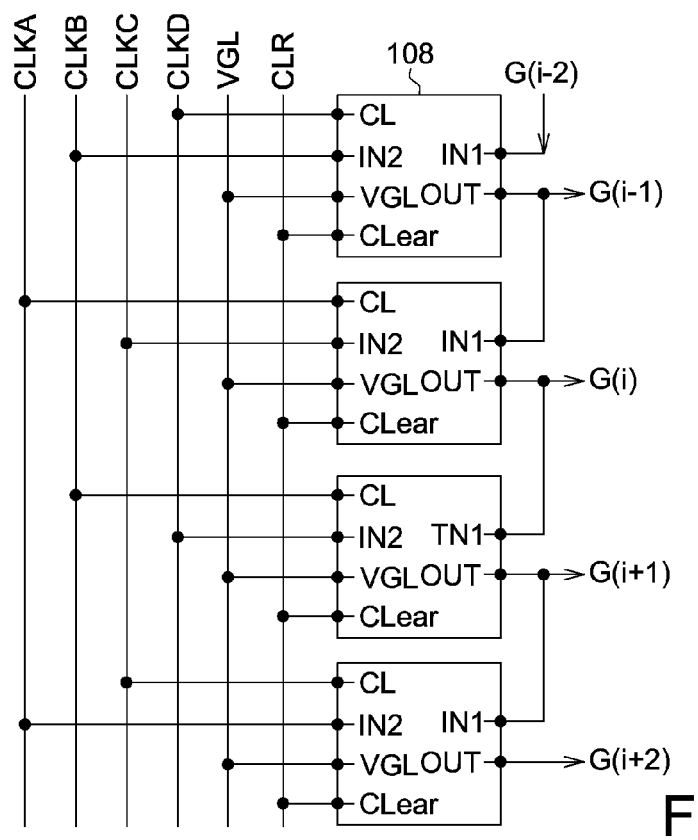
FIG. 9 shows a gate driver according to one embodiment of the present disclosure.

FIG. 9 shows a gate driver 900 according to one embodiment of the present disclosure. The gate driver circuit 900 can be used as the gate driver 104 shown in FIG. 1, but the present disclosure is not limited thereto.

The gate driver 900 comprises a plurality of stages of gate driver circuits 108. As shown in FIG. 9, the $(i-1)^{th}$ to $(i+2)^{th}$ stages of gate driver circuits 108 are respectively configured to output the first gate signals G(i−1) to G(i+2). In the embodiment, the gate driver circuits 108 may output the first gate signals G(i−1) to G(i+2) in response to four clock signals CLKA, CLKB, CLKC and CLKD.

As shown in FIG. 9, the clock signal CLKA is applied to the first clock input CL of the $i^{th}$ stage gate driver circuit and the second input IN2 of the $(i+2)^{th}$ stage gate driver circuit 108. The clock signal CLKB is applied to the second input IN2 of the $(i-1)^{th}$ stage gate driver circuit 108 and the first clock input CL of the $(i+1)^{th}$ stage gate driver circuit 108. The clock signal CLKC is applied to the second input IN2 of the $i^{th}$ stage gate driver circuit 108 and the first clock input CL of the $(i+2)^{th}$ stage gate driver circuit 108. The clock signal CLKD is applied to the first clock input CL of the $(i-1)^{th}$ stage gate driver circuit and the second input IN2 of the $(i+1)^{th}$ stage gate driver circuit. Note that for illustrative simplicity, only four stages of the gate driver circuits 108 are shown in FIG. 9. However, the scope and spirit of the invention can also be applied to the gate driver circuit 108 with more or less than four stages of the gate driver circuits 108, and the invention is not limited thereto. Those who are skilled in this technology can still make various alterations and modifications without departing from the scope and spirit of this disclosure.

Figure 10:
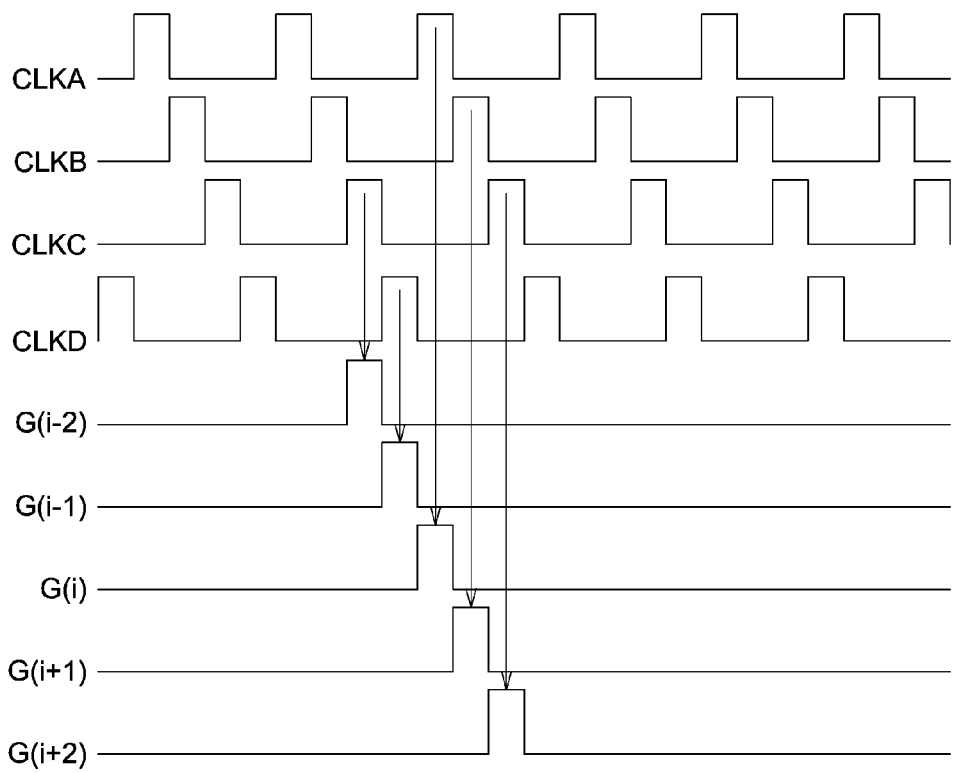
FIG. 10 shows waveforms of the gate driver according to one embodiment of the present disclosure.

FIG. 10 shows waveforms of the gate driver 900 according to one embodiment of the present disclosure. As shown in FIG. 9, the clock signals CLKA, CLKB, CLKC and CLKD are enabled sequentially in a time sequence. In response to the clock signals CLKA, CLKB, CLKC and CLKD, the first gate signals G(i−1), G(i), G(i+1) and G(i+2) can be outputted sequentially. Comparing FIGS. 8 and 10, it can be obtained that the time delay between the pulses of the first gate signals G(i−1) to G(i+2) of the gate driver 900 is shorter than that of the first gate signals G(i−1) to G(i+2) of the gate driver 700.

Figure 11:
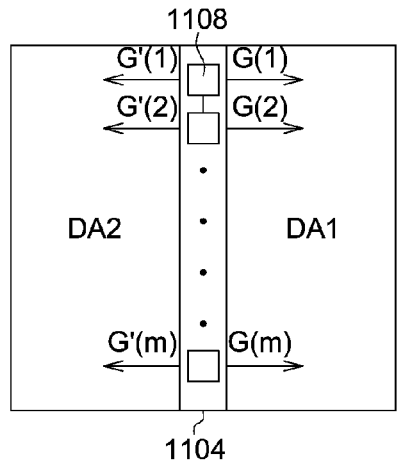
FIG. 11 shows a display device according to one embodiment of the present disclosure.

FIG. 11 shows a display device 1100 according to one embodiment of the present disclosure. The display device 1100 comprises a first display area DA1 for displaying a first image, a second display area DA2 for displaying a second image, and a 2-zone gate driver 1104 for driving both of the first and second display areas DA1 and DA2.

The 2-zone gate driver 1104 comprises a plurality of gate driver circuits 1108 cascade-connected to each other for sequentially outputting a plurality of first gate signals G(1)-G(m) to the first display area DA1 and outputting a plurality of second gate signals G'(1)-G'(m) to the second display area DA2. The gate scan frequency of the first display area DA1 can be different from that of the second display area DA2. For example, if the first display area DA1 is used as a primary display area and the second display area DA2 is used as a secondary display area, the gate scan frequency of the first display area DA1 may be higher than that of the second display area DA2.

Figure 12:
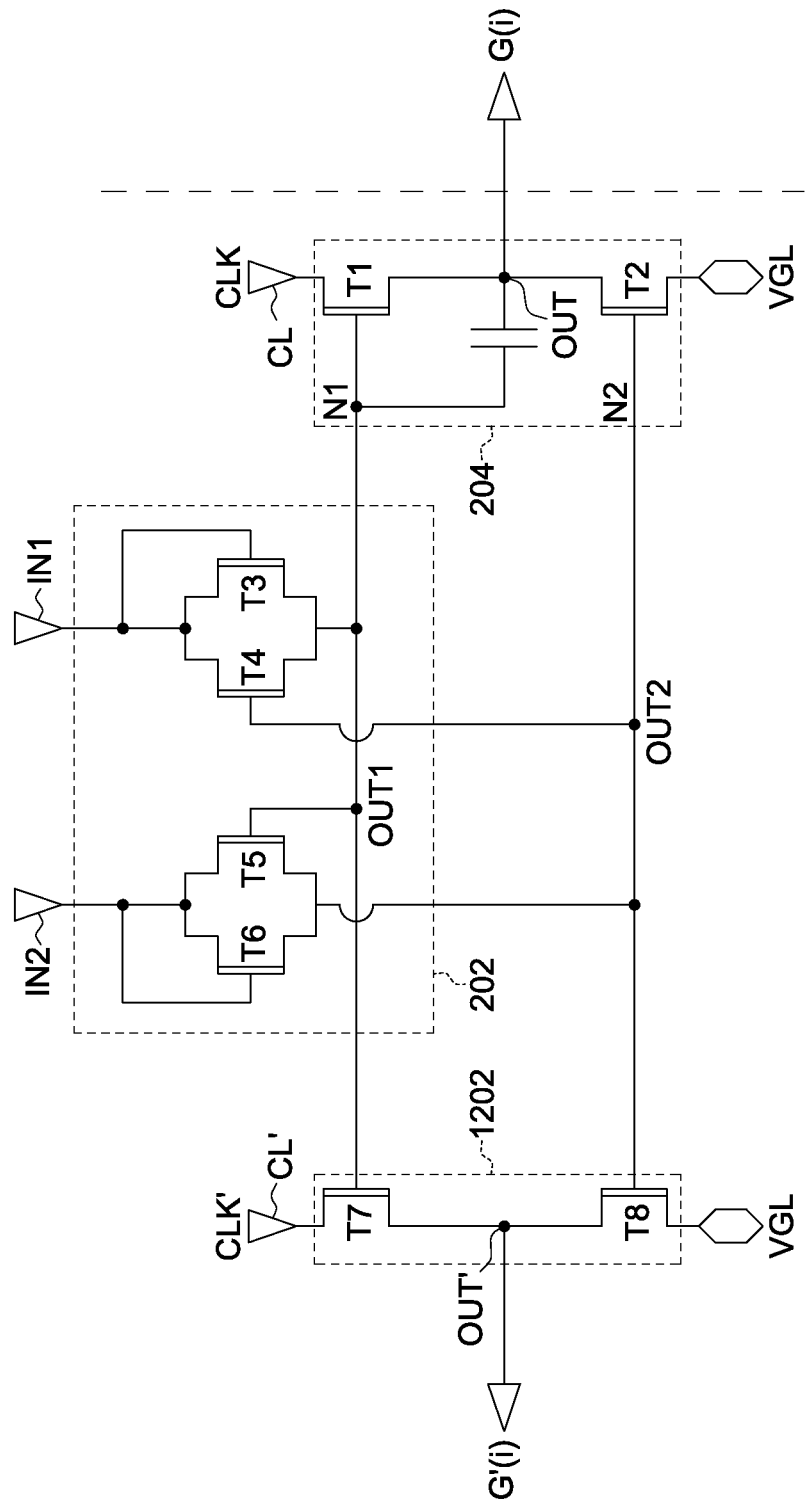
FIG. 12 shows a circuit diagram of the gate driver circuit according to one embodiment of the present invention.

FIG. 12 shows a circuit diagram of the gate driver circuit 1108 according to one embodiment of the present invention. The elements in the embodiment and in the previous embodiments sharing the same labeling are the same elements, and the description of which are as aforementioned. The main difference between the gate driver circuit 1108 and the gate driver circuit 200 shown in FIG. 2 is that the gate driver circuit 1108 further comprises a second output circuit 1202 for outputting an $i^{th}$ second gate signal G'(i).

In one embodiment, the gate driver circuit 1108 may further comprise an initialization circuit 402. In one embodiment, the transistors included the gate driver circuit 1108 can be realized by p-channel transistors.

The second output circuit 1202 comprises a seventh transistor T7 and an eighth transistor T8. The seventh transistor T7 includes a control terminal coupled to the first output OUT1, a first terminal coupled to a second clock input CL' for receiving a clock signal CLK' and a second terminal coupled to a second output node OUT' for outputting the $i^{th}$ second gate signal G'(i). The eighth transistor T8 includes a control terminal coupled to the second output OUT2, a first terminal coupled to the second output node OUT' and a second terminal coupled to the reference signal VGL. In one embodiment, the clock signal CLK' is synchronized with CLK. In one embodiment, the frequency of the clock signal CLK' is different from that of the clock signal CLK.

Figure 13:
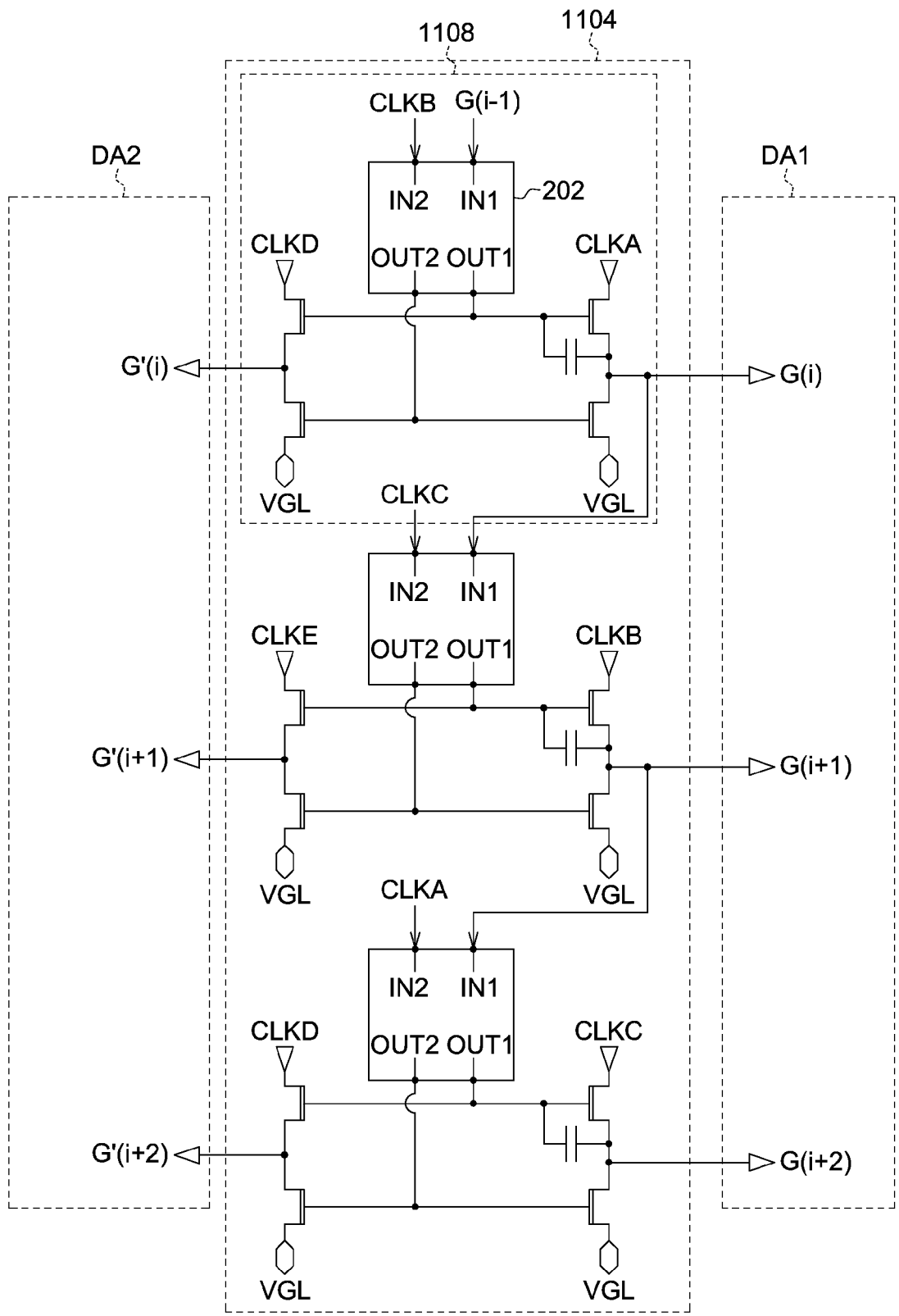
FIG. 13 shows an example of the gate driver according to one embodiment of the present disclosure.

FIG. 13 shows an example of the gate driver 1104 according to one embodiment of the present disclosure. As shown in FIG. 13, the gate driver 1104 comprises a plurality of stages of gate driver circuits 1108. In response to clock signals CLKA, CLKB, CLKC, CLKD and CLKE, the gate driver circuits 1108 may output the first gate signals G(i) to G(i+2) to the first display area DA1, and output the second gate signals G'(i) to G'(i+2) to the second display areas DA2. Specifically, the gate scan function of the first display area DA1 can be controlled by the clock signals CLKA, CLKB and CLKC, while the gate scan function of the second display area DA2 can be controlled by the clock signals CLKD and CLKE. In one embodiment, the clock signals CLKD and CLKE can realize a low-refresh scan (e.g., with a scan frequency of 1-10 Hz) and/or partial scan (e.g., only scanning the row of pixels to be updated with new data) for the second display area DA2, independently from the first display area DA1.

Figure 14:
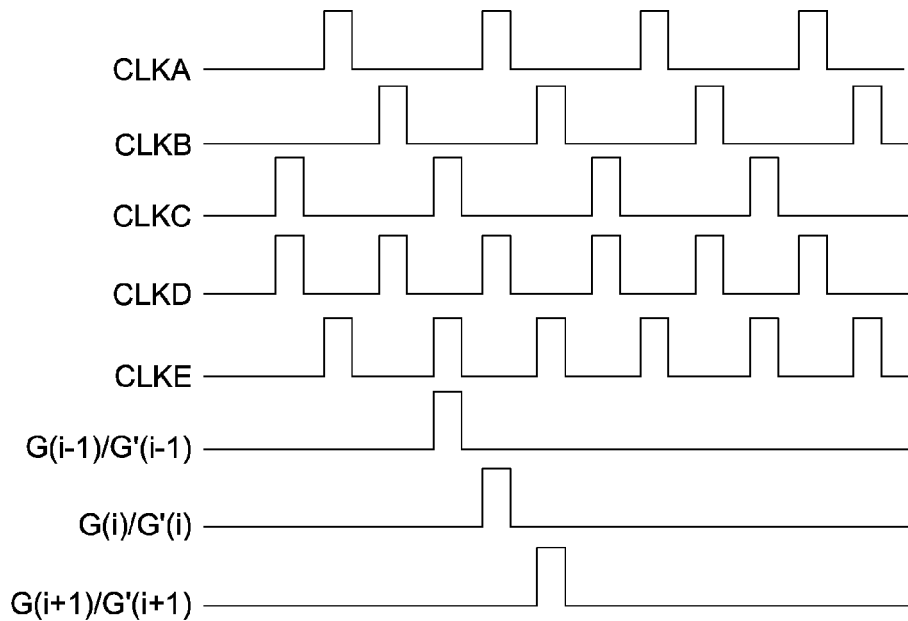
FIG. 14 shows waveforms of the gate driver according to one embodiment of the present disclosure.

FIG. 14 shows waveforms of the gate driver 1104 according to one embodiment of the present disclosure. As shown in FIG. 14, the clock signals CLKD and CLKE for the second display area DA2 can be synchronized to the clock signals CLKA, CLKB and CLKC because the latch circuits 202 of the gate driver circuits 1108 are controlled by the clock signals CLKA, CLKB and CLKC.

Figure 15:
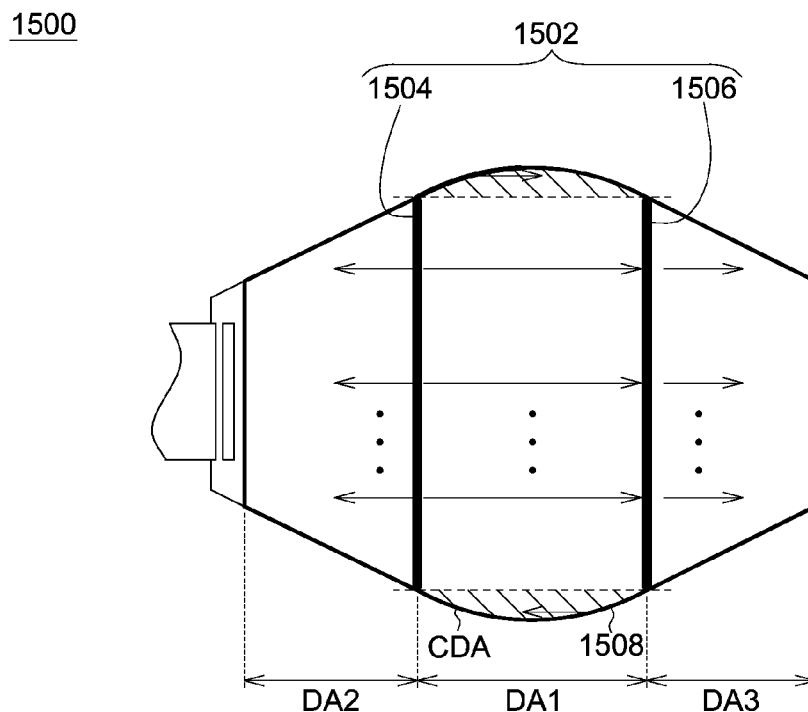
FIG. 15 shows a display device according to one embodiment of the present disclosure.

FIG. 15 shows a display device 1500 according to one embodiment of the present disclosure. The display device 1500 comprises a first display area DA1 for displaying a first image, a second display area DA2 for displaying a second image, a third display area DA3 for displaying a third image and a 3-zone gate driver 1502 for driving the first to third display areas DA1, DA2 and DA3. The 3-zone gate driver 1502 comprises a first gate driver 1504 and a second gate diver 1506. The first gate driver 1504 can be a 2-zone gate driver like the gate driver 1104 show in FIG. 11, which is configured to drive both of the first and second display areas DA1 and DA2. The second gate driver 1506 is configured to drive the third display area DA3. In one embodiment, the first display area DA1 comprises convex display areas CDA. The convex display areas CDA can be driven by at least one single-zone gate driver like the gate drivers shown in FIGS. 7 and 9. In one embodiment, the display device 1500 can be used in, but not limited to, a smart watch, It is understood that the arrangement/shape of the first to third display areas DA1-DA3 are for illustrating purposes, not for restriction purposes, since the present disclosure may be implemented in many different ways in accordance with practical needs.

Figure 16:
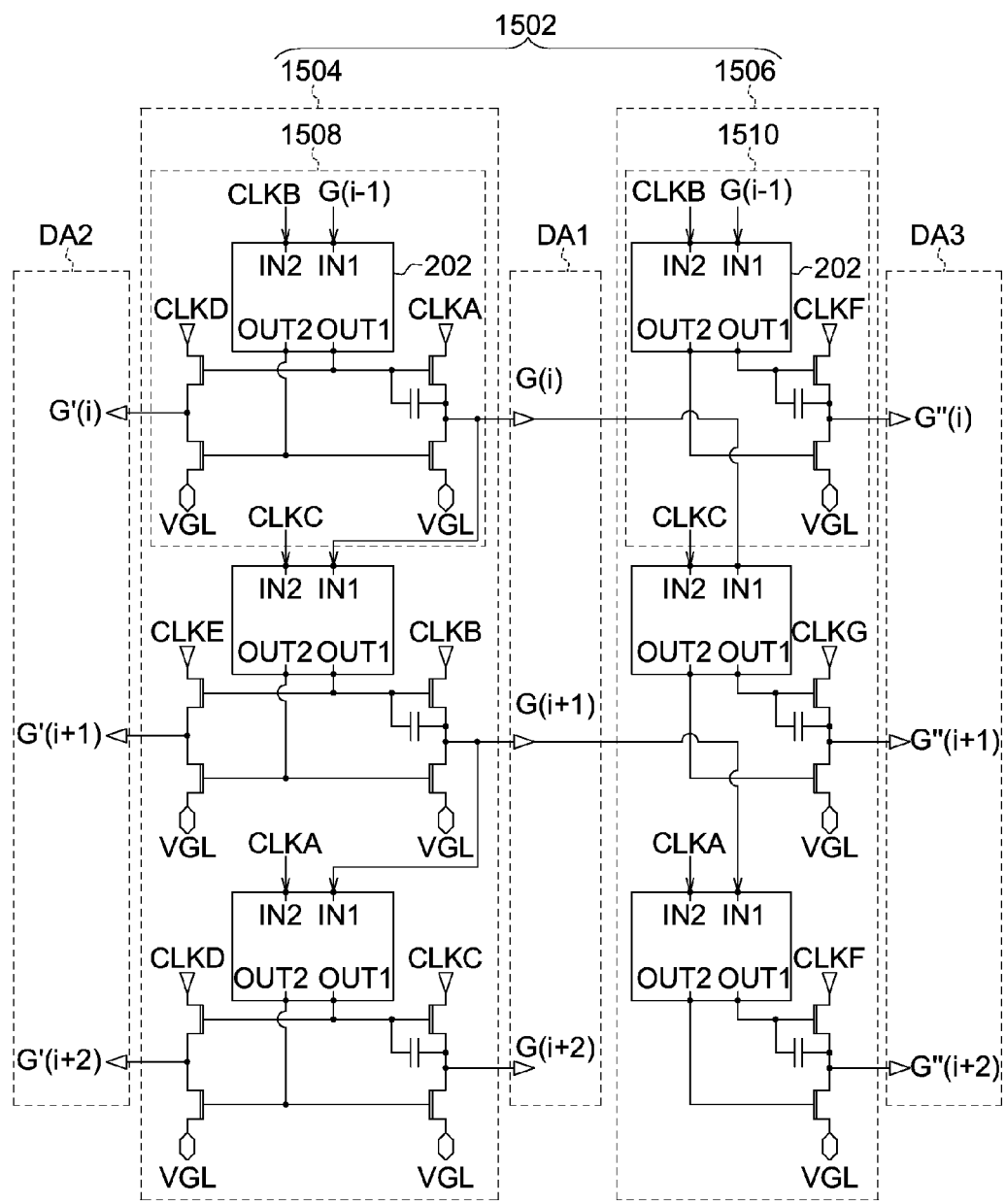
FIG. 16 shows an example of the 3-zone gate driver according to one embodiment of the present disclosure.

FIG. 16 shows an example of the 3-zone gate driver 1502 according to one embodiment of the present disclosure. In the 3-zone gate driver 1502, the first gate driver 1504 comprises a plurality of gate driver circuits 1508 cascade-connected to each other for sequentially outputting a plurality of first gate signals G(1)-G(m) to the first display area DA1 and outputting a plurality of second gate signals G'(1)-G'(m) to the second display area DA2. The second gate driver 1506 comprises a plurality of gate driver circuits 1510 cascade-connected to each other for sequentially outputting a plurality of third gate signals G"(1)-G"(m) to the third display area DA3. Specifically, in response to the first gate signals G(1)-G(m) outputted by the first gate driver 1504, the second driver 1506 can output the third gate signals G"(1)-G"(m) to the third display area DA3.

FIG. 17 shows waveforms of the 3-zone gate driver 1502 according to one embodiment of the present disclosure. As shown in FIG. 17, the clock signals CLKD and CLKE for the second display area DA2 and the clock signals CLKF and CLKG for the third display area DA3 are synchronized to the clock signals CLKA, CLKB and CLKC because the latch circuits 202 of the first and second gate driver circuits 1508 and 1510 can be controlled by the clock signals CLKA, CLKB and CLKC. In the embodiment, the clock signals CLKA, CLKB and CLKC realize a full scan for the first display area DA1, the clock signals CLKD and CLKE realize a low-refresh scan (e.g., 1-10 Hz) for the second display area DA2, and the clock signals CLKF and CLKG realize a partial scan for the second display area DA3. It is understood that the scan functions applied to the first to third display areas DA1-DA3 are for illustrating purposes, not for restriction purposes, since the present disclosure may be implemented in many different ways in accordance with practical needs.

In summary, the present disclosure provides a gate driver/display device that uses less number of components and input signals. Therefore, the layout area and power consumption of the gate driver/display device of the present disclosure can be reduced. Moreover, the gate driver of the present disclosure can be used in a multi-zone display device. Because the gate driver can respectively perform adaptive scan functions for the display areas of the multi-zone display device, the power consumption of the multi-zone display device can be further reduced.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:
1. A gate driver, comprising:
a plurality of gate driver circuits cascade-connected to each other, for outputting a plurality of first gate signals sequentially, wherein an $i^{th}$ stage gate driver circuit of the gate driver circuits, where i is an integer, comprises:
a latch circuit including:

a first input for receiving an $(i-1)^{th}$ gate signal of the gate signals from an $(i-1)^{th}$ stage gate driver circuit of the gate driver circuits;

a second input for receiving a first clock signal;

a first output for outputting a first output signal in response to the $(i-1)^{th}$ gate signal and the first clock signal; and a second output for outputting a second output signal being an inverted signal of the first output signal; and a first output circuit for outputting an $i^{th}$ first gate signal, comprising:

a first transistor including a control terminal coupled to the first output, a first terminal coupled to a first clock input for receiving a second clock signal and a second terminal coupled to a first output node for outputting the $i^{th}$ first gate signal;

a second transistor including a control terminal coupled to the second output, a first terminal coupled to the first output node and a second terminal coupled to a reference signal; and a capacitor coupled between the control terminal of the first transistor and the first output node.

2. The gate driver of claim 1, wherein when the $(i-1)^{th}$ gate signal is enabled and the first clock signal is disabled, the first transistor is turned on by the first output signal and the second transistor is turned off by the second output signal so that the voltage level of the $i^{th}$ first gate signal follows the voltage level of the second clock signal.

3. The gate driver of claim 1, wherein when the $(i-1)^{th}$ gate signal is disabled and the first clock signal is enabled, the first transistor is turned off by the first output signal and the second transistor is turned on by the second output signal so that the voltage level of the $i^{th}$ first gate signal is reset by the reference signal.

4. The gate driver of claim 1, wherein the latch circuit comprises:

a third transistor including a control terminal coupled to the first input, a first terminal coupled to the first output and a second terminal coupled to the first input;

a fourth transistor including a control terminal coupled to the second output, a first terminal coupled to the first output and a second terminal coupled to the first input;

a fifth transistor including a control terminal coupled to the first output, a first terminal coupled to the second output and a second terminal coupled to the second input; and a sixth transistor including a control terminal coupled to the second input, a first terminal coupled to the second output and a second terminal coupled to the second input.

5. The gate driver of claim 1, wherein the $i^{th}$ stage gate driver circuit further comprises:

an initialization circuit, for initializing the voltage levels of the first output and second output by the reference signal and a clearing signal, respectively in response to the clearing signal.

6. The gate driver of claim 5, wherein the initialization circuit comprises:

a first initialization transistor including a control terminal coupled to a clearing terminal for receiving the clearing signal, a first terminal coupled to the clearing terminal, and a second terminal coupled to the second output; and a second initialization transistor including a control terminal coupled to the clearing terminal, a first terminal coupled to the first output, and a second terminal coupled to the reference signal.

7. The gate driver of claim 1, wherein the gate driver circuits outputs the first gate signals in response to the first clock signal, the second clock signal and a third clock signal, and the second clock signal, the first clock signal and the third clock signal are enabled sequentially in a time sequence, wherein:

the first clock signal is applied to the second input of the $i^{th}$ stage gate driver circuit and the first clock input of an $(i+1)^{th}$ stage gate driver circuit of the gate driver circuits;

the second clock signal is applied to the second input of the $(i-1)^{th}$ stage gate driver circuit and the first clock input of the $i^{th}$ stage gate driver circuit;

the third clock signal is applied to the first clock input of the $(i-1)^{th}$ stage gate driver circuit and the second input of an $(i+1)^{th}$ stage gate driver circuit of the gate driver circuits.

8. The gate driver of claim 1, wherein the gate driver circuits outputs the gate signals in response to the first clock signal, the second clock signal, a third clock signal and a fourth clock signal, and the second clock signal, the third clock signal, the first clock signal and the fourth clock signal are enabled sequentially in a time sequence, wherein:

the first clock signal is applied to the second input of the $i^{th}$ stage gate driver circuit and the first clock input of an $(i+2)^{th}$ stage gate driver circuit of the gate driver circuits;

the second clock signal is applied to the first clock input of the $i^{th}$ stage gate driver circuit and the second input of the $(i+2)^{th}$ stage gate driver circuit;

the third clock signal is applied to the second input of the $(i-1)^{th}$ stage gate driver circuit and the first clock input of an $(i+1)^{th}$ stage gate driver circuit of the gate driver circuits;

the forth clock signal is applied to the first clock input of the $(i-1)^{th}$ stage gate driver circuit and the second input of the $(i+1)^{th}$ stage gate driver circuit.

9. The gate driver of claim 1, wherein the $i^{th}$ stage gate driver circuit further comprises:

a second output circuit for outputting an $i^{th}$ second gate signal, comprising:

a seventh transistor including a control terminal coupled to the first output, a first terminal coupled to a second clock input for receiving a fifth clock signal and a second terminal coupled to a second output node for outputting the $i^{th}$ second gate signal; and an eighth transistor including a control terminal coupled to the second output, a first terminal coupled to the second output node and a second terminal coupled to the reference signal.

10. A display device, comprising:

a first display area for displaying a first image; and a first gate driver for outputting a plurality of first gate signals to the first display area, comprising:

a plurality of gate driver circuits cascade-connected to each other, for outputting the first gate signals sequentially, wherein an $i^{th}$ stage gate driver circuit of the gate driver circuits, where i is an integer, comprises:

a latch circuit including:

a first input for receiving an $(i-1)^{th}$ gate signal of the gate signals from an $(i-1)^{th}$ stage gate driver circuit of the gate driver circuits;

a second input for receiving a first clock signal;

a first output for outputting a first output signal in response to the $(i-1)^{th}$ gate signal and the first clock signal; and a second output for outputting a second output signal being an inverted signal of the first output signal; and a first output circuit for outputting an i$^{th}$ first gate signal, comprising:
- a first transistor including a control terminal coupled to the first output, a first terminal coupled to a first clock input for receiving a second clock signal and a second terminal coupled to a first output node for outputting the i$^{th}$ first gate signal;
- a second transistor including a control terminal coupled to the second output, a first terminal coupled to the first output node and a second terminal coupled to a reference signal; and
- a capacitor coupled between the control terminal of the first transistor and the first output node.

11. The display device of claim 10, wherein when the (i−1)$^{th}$ gate signal is enabled and the first clock signal is disabled, the first transistor is turned on by the first output signal and the second transistor is turned off by the second output signal so that the voltage level of the i$^{th}$ first gate signal follows the voltage level of the second clock signal.

12. The display device of claim 10, wherein when the (i−1)$^{th}$ gate signal is disabled and the first clock signal is enabled, the first transistor is turned off by the first output signal and the second transistor is turned on by the second output signal so that the voltage level of the i$^{th}$ first gate signal is reset by the reference signal.

13. The display device of claim 10, wherein the latch circuit comprises:
- a third transistor including a control terminal coupled to the first input, a first terminal coupled to the first output and a second terminal coupled to the first input;
- a fourth transistor including a control terminal coupled to the second output, a first terminal coupled to the first output and a second terminal coupled to the first input;
- a fifth transistor including a control terminal coupled to the first output, a first terminal coupled to the second output and a second terminal coupled to the second input; and
- a sixth transistor including a control terminal coupled to the second input, a first terminal coupled to the second output and a second terminal coupled to the second input.

14. The display device of claim 10, wherein the i$^{th}$ stage gate driver circuit further comprises:
- an initialization circuit, for initialing the voltage levels of the first output and second output by the reference signal and a clearing signal, respectively in response to the clearing signal.

15. The display device of claim 14, wherein the initialization circuit comprises:
- a first initialization transistor including a control terminal coupled to a clearing terminal for receiving the clearing signal, a first terminal coupled to the clearing terminal, and a second terminal coupled to the second output; and
- a second initialization transistor including a control terminal coupled to the clearing signal, a first terminal coupled to the first output, and a second terminal coupled to the reference signal.

16. The display device of claim 10, wherein the gate driver circuits outputs the first gate signals in response to the first clock signal, the second clock signal and a third clock signal, and the second clock signal, the first clock signal and the third clock signal are enabled sequentially in a time sequence, wherein:
- the first clock signal is applied to the second input of the i$^{th}$ stage gate driver circuit and the first clock input of an (i+1)$^{th}$ stage gate driver circuit of the gate driver circuits;
- the second clock signal is applied to the second input of the (i−1)$^{th}$ stage gate driver circuit and the first clock input of the i$^{th}$ stage gate driver circuit;
- the third clock signal is applied to the first clock input of the (i−1)$^{th}$ stage gate driver circuit and the second input of an (i+1)$^{th}$ stage gate driver circuit of the gate driver circuits.

17. The display device of claim 10, wherein the gate driver circuits outputs the gate signals in response to the first clock signal, the second clock signal, a third clock signal and a fourth clock signal, and the second clock signal, the third clock signal, the first clock signal and the fourth clock signal are enabled sequentially in a time sequence, wherein:
- the first clock signal is applied to the second input of the i$^{th}$ stage gate driver circuit and the first clock input of an (i+2)$^{th}$ stage gate driver circuit of the gate driver circuits;
- the second clock signal is applied to the first clock input of the i$^{th}$ stage gate driver circuit and the second input of the (i+2)$^{th}$ stage gate driver circuit;
- the third clock signal is applied to the second input of the (i−1)$^{th}$ stage gate driver circuit and the first clock input of an (i+1)$^{th}$ stage gate driver circuit of the gate driver circuits;
- the forth clock signal is applied to the first clock input of the (i−1)$^{th}$ stage gate driver circuit and the second input of the (i+1)$^{th}$ stage gate driver circuit.

18. The display device of claim 10, further comprising:
a second display area for displaying a second image;
wherein the gate driver further outputs a plurality of second gate signals to the second display area, and the i$^{th}$ stage gate driver circuit further comprises:
- a second output circuit for outputting an i$^{th}$ second gate signal of the second gate signals to the second display area, comprising:
  - a seventh transistor including a control terminal coupled to the first output, a first terminal coupled to a second clock input for receiving a fifth clock signal and a second terminal coupled to a second output node for outputting the i$^{th}$ second gate signal; and
  - an eighth transistor including a control terminal coupled to the second output, a first terminal coupled to the second output node and a second terminal coupled to the reference signal.

19. The display device of claim 18, further comprising:
a third display area for displaying a third image; and
a second driver for outputting a plurality of third gate signals to the third display area in response to the first gate signals of the gate driver.

20. The display device of claim 19, wherein the an i$^{th}$ gate driver circuit of the second gate driver receives the (i−1)$^{th}$ gate signal of the first gate driver to output an i$^{th}$ third gate signal of the third gate signals to the third display area.

* * * * *